United States Patent [19]
Kato

[11] 4,055,798
[45] Oct. 25, 1977

[54] ROTARY ELECTRIC FIELD INTENSITY MEASURING DEVICE

[76] Inventor: Giichiro Kato, 36–12 Yoyogi 1-chome, Shibuya, Tokyo, Japan

[21] Appl. No.: 662,281

[22] Filed: Feb. 27, 1976

[30] Foreign Application Priority Data

Aug. 25, 1975 Japan .............................. 50-102758

[51] Int. Cl.² .................. G01R 5/28; G01R 31/02
[52] U.S. Cl. ........................................ 324/32; 324/72
[58] Field of Search ............... 324/71, 72, 109, 32, 324/76; 310/5; 317/101, DIG. 2

[56] References Cited

U.S. PATENT DOCUMENTS

| | | | |
|---|---|---|---|
| 2,815,483 | 12/1957 | Kaufman | 324/72 |
| 3,253,207 | 5/1966 | Jauch | 324/72 X |
| 3,544,889 | 12/1970 | Alauz et al. | 324/32 |
| 3,812,419 | 5/1974 | Kaunzinger | 324/32 |
| 3,846,700 | 11/1974 | Sasaki et al. | 324/72 |

Primary Examiner—Rudolph V. Rolinec
Assistant Examiner—Vincent J. Sunderdick
Attorney, Agent, or Firm—Woodling, Krost, Granger & Rust

[57] ABSTRACT

A rotary electric field intensity measuring device comprising a grounded housing, an amplifier mounted within said housing and electrically connected to an external recording device, an electric motor mounted within said housing and having an output shaft, said motor being adapted to be connected to an external power source, a rotary grounded shielding conical electrode means having a rotary shaft connected to said output shaft of the motor for rotation therewith and alternating voltage inducing means and a shielded stationary conical electrode means secured to said housing within said shielding rotary electrode means in spaced relationship to the latter and having alternating voltage inducing means in cooperation with said alternating voltage inducing means of the rotary electrode means.

8 Claims, 3 Drawing Figures

U.S. Patent      October 25, 1977      4,055,798
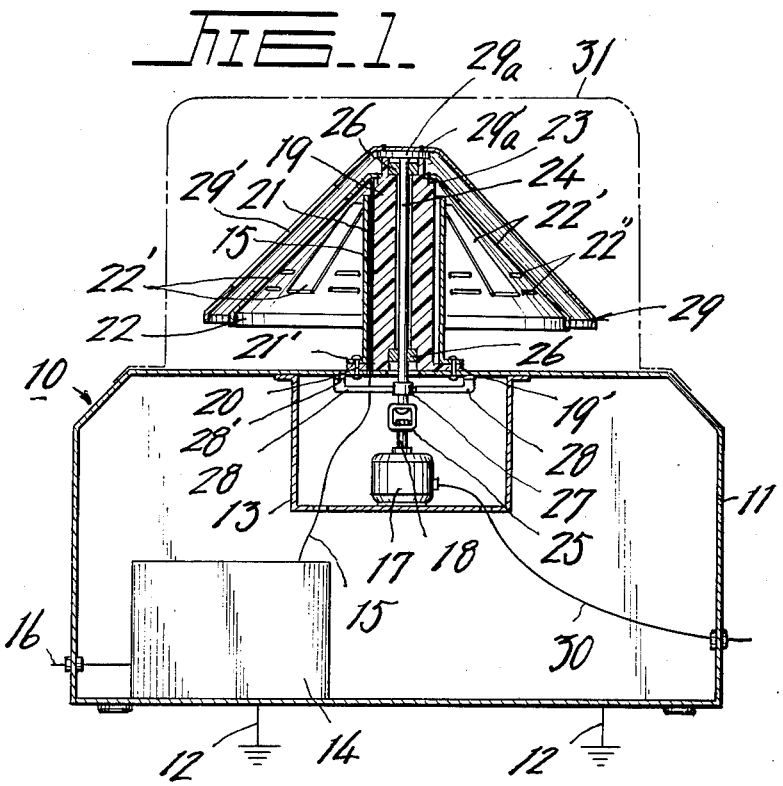
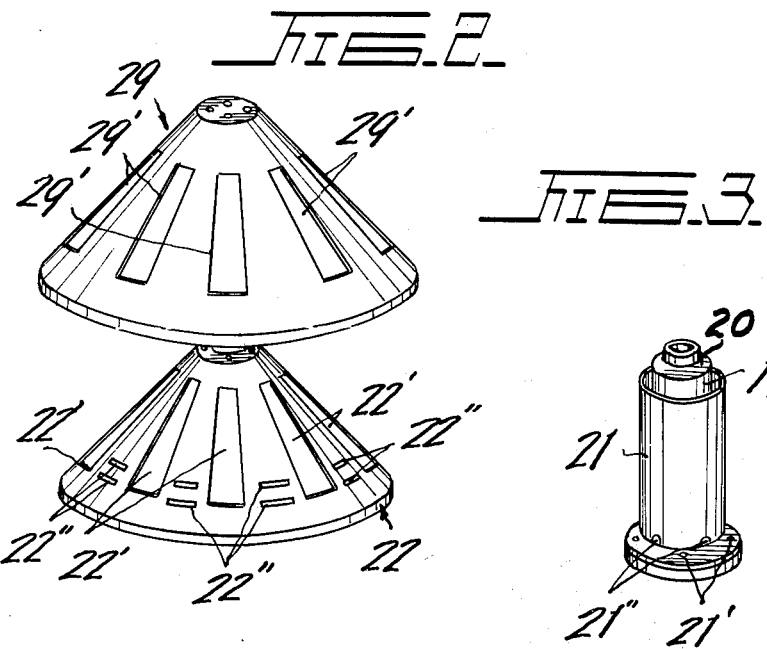

ROTARY ELECTRIC FIELD INTENSITY MEASURING DEVICE

BACKGROUND OF THE INVENTION

This invention relates to an electric field intensity measuring device suitably employed in the open air under severe weather conditions and more particularly, to a rotary electric field intensity measuring device of the above type which includes a pair of electrode means having alternating voltage inducing means, respectively.

An increasing number of open air leisure facilities such as golf courses for example, have been and being built even in regions where thunderbolts quite frequently stike and as a result, increasing attention has been paid to safety of players playing and employees working in such leisure facilities and regulations relating to personal safety in the open air leisure fecilities have become more and more severe.

When it is forecasted that a thunderbolt seem to stike in a golf course, it is necessary to evacuate the players and employees rapidly out of the golf course to a safe location. In order to determine whether the players and emplyees should be evacuated out of the golf course or not, a number of thunder alarms have been developed and practically operated and as one most advanced or improved type thunder alarm, devices adapted to detect the electric field intensity on the surface of a selected ground and provide an alarming signal in response to the detection of a particular value of electric field intensity have been developed. Of the most advanced thunder alarming devices, the so-called rotary electric field intensity measuring devices have been most often accepted because of their simplicity in construction and high reliability in performance.

When the rotary electric field intensity measuring device is operated in the open air rather than in a laboratory for the under forecast, in practice, it is particularly important to ensure that the device perform its function properly without being adversely affected even when exposed to wind and rain and provide a reliable and precise measuring result.

However, the conventional rotary electric field intensity measuring device has the disadvantages that the insulation between the opposed charge induction faces and ground deteriorates when the device is operated in heavy rain and that the space defined between the charge induction faces is soon filled with rain water to thereby electrically connect the charge induction faces together throughout their area resulting in substantial reduction in induced voltage. In order to eliminate the disadvantages inherent in the conventional rotary electric field intensity measuring device, an insulator having a high resistance (silicone, for example) is usually employed between the charge induction faces and ground. Although the use of such a high resistance insulator may improve the insulation, electrostatic charge remains on the surface of the insulator for a long time after the deactuation of the device and will not disappear easily which may tend to cause error in measuring of electric field intensity by the device. Due to the disadvantages inherent in the conventional rotary electric field intensity measuring device referred to hereinabove, the timing of thunderbolt discharge will not always correspond to the electric field intensity measured by the measuring device. Thus, when the conventional rotary electric field intensity measuring device is operated as a thunder alarm for forecasting thunderbolt discharge, the device encounters difficulties in forecasting the timing of thunderbolt discharge with preciseness.

SUMMARY OF THE INVENTION

Therefore, one object of the present invention is to provide a rotary electric field intensity measuring device which can maintain its high insulation and is not adversely affected by electrostatic charge.

According to the present invention, as distinguished from the conventional arrangement in which a stationary electrode is connected to a group of induction plates adhered to an insulator and they are connected together into a unitary structure by means of connector lines, a stationary electrode having alternating voltage inducing means in the form of openings is fixedly secured to the grounded housing of the measuring device by means of a shielded insulative support column which is also fixedly secured to the housing. In the arrangement of the electric field intensity measuring device of the invention when the device is operated in the rain, since the induction plates or stationary and rotary electrodes are adapted to be electrically connected together by rain water only infrequently and at only selected areas thereof, rather than the whole areas of the two electrodes being connected together with rain water, and since a high insulation is provided between the stationary electrode and ground, there is no possibility that the induced voltage will be materially reduced during rain. Although a further advantage may be obtained when silicone varnish or the like is applied on the insulation support column, the higher the resistance of the insulation column is, the longer time the electrostatic charge remains on the surface of the column after the deactuation of the device and therefore, it is necessary to dispose a grounded shielding plate in the form of a metal cylinder about the insulation column in a suitably spaced relationship to the column. The advantages of the shielding metal cylinder will be enumerated hereinbelow.

1. The surface of the insulation support column is protected from being directly exposed to rain water.

2. When the insulation support column is formed of a high resistance material (silicone, for example), although the insulation may be increased, but electrostatic charge will remain on the surface of the column for a prolonged time after the deactuation of the device resulting in error in measuring of electric field intensity. However, when the shielding metal cylinder is employed in conjunction with the insulation support column in the manner mentioned hereinabove, the electric field due to the electrostatic charge on the insulation support is confined within the space defined between the insulation support and metal cylinder to thereby eliminate the difficulties caused by the electrostatic charge.

The above and other objects, features and advantages of the present invention will be more readily apparent to those skilled in the art from a reading of the following detailed description in conjunction with the accompanying drawing which shows one preferred embodiment of the invention for illustration purpose only, but not for limiting the scope of the same in any way.

BRIEF DESCRIPTION OF THE DRAWING

FIG. 1 is a vertical sectional view of one preferred embodiment of rotary electric field intensity measuring device constructed in accordance with the present invention;

FIG. 2 is an exploded perspective view of the electrode assembly of said rotary electric field intensity measuring device; and FIG. 3 is a perspective view of the insulation support column and shielding cylinder assembly of said rotary electric field intensity measuring device.

PREFERRED EMBODIMENT OF THE INVENTION

The present invention will be now described with reference to the accompanying drawing which shows one preferred embodiment of rotary electric field intensity measuring device of the invention for illustration purpose only, but not for limiting the scope of the same in any way. The rotary electric field intensity measuring device is generally shown by reference numeral 10 and generally includes a hollow cylindrical conductive housing 11 connected to ground 12 and having a motor compartment 13 defined in the center of the upper portion of the housing. An amplifier 14 is mounted on the bottom wall of the housing 11 and has an input side connected to one end of an induced charge take-out line 15 and an output side connected to an amplifier output take-out line 16 which leads to a suitable thunderbolt alarm (not shown) which is in turn connected to a suitable recording meter (not shown). A conventional suitable electric motor 17 is mounted within the motor compartment 13 of the housing 11 and has the output shaft 18. A hollow cylindrical insulative stationary electrode support column 19 extends vertically from the top wall of the housing 11 in the center thereof and has an outwardly and horizontally extending flange at the bottom end of the column which rides on the housing top wall. The flange has a plurality of holes 19' in a circumferentially spaced relationship. A metal sleeve 21 which has a diameter greater than that of the stationary electrode support column 19 is disposed about the column in a peripherally spaced relationship to the latter to define an annular space therebetween through which the induced charge take-out line 15 extends. The sleeve 21 is also formed at the lower end with an outwardly and horizontally extending flange which rides on the flange of the support column 19. The sleeve 21 is also provided with a plurality of circumferentially spaced holes 21' in alignment with the corresponding holes 19' in the flange of the support column 19 and a plurality of drainage holes 21" at the bottom end of the body of the sleeve. A suitable conventional fastening means 20 extends through the aligned holes 19' and 21' in the flanges of the support column and sleeve and holes (not shown) in the top wall of the housing 11 so that both the support column and sleeve can be fixedly secured to the housing 11 and grounding the metal sleeve 21. The diameter of the upper portion of the hollow cylindrical stationary electrode support column 19 is reduced to provide a shoulder 20 for the purpose to be described hereinafter. A frusto-conical stationary electrode 22 is fixedly secured at the upper end to the shoulder 20 of the column 19 by means of suitable fastening means 23. The other end of the induced charge take-out line 15 is connected to the stationary electrode means 22. The construction of the stationary electrode 22 will be in detail described hereinafter. A rotary shielding electrode supporting shaft 24 extends through the hollow interior of the column 19 with the lower end extending into the motor compartment 13 and connected to the output shaft 18 of the electric motor 17 by means of a flexible and insulative coupling 25. The rotary shaft 24 is journalled at suitable points along the length of the shaft in upper and lower bearings 26, 26 which are in turn suitably supported in the support column 19. A slip ring 27 is integrally formed about the rotary shaft 24 in the portion of the shaft disposed within the motor compartment 13. A pair of brushes or spring ground contacts 28, 28 are provided with the outer ends secured to the housing top wall by means of suitable fastening means 28' and the inner or free ends in contact with the slip ring 27. A frusto-conical rotary shielding electrode 29 is fixedly secured at the top thereof to the upper end of the rotary shaft 24 for rotation with the shaft by suitable fastening means 29' a with a metal plate 29a interposed therebetween. Thus, it will be understood that the shielding rotary electrode 29 is connected to ground 12 through the rotary shaft 24, ground contacts 28 and housing 11. The rotary shielding electrode 29 has a shape substantially similar to that of the stationary electrode, but the dimensions of the rotary electrode are greater than those of the stationary electrode to thereby define an annular space having a frusto-conical cross-section between the two electrodes for the purpose to be described hereinafter. Reference numeral 30 denotes a shielded cord connected at one end to the electric motor 17 and adapted to be connected at the other end to a suitable external power source (not shown) which may be a domestic wall socket, for example. Reference numeral 31 denotes a detachable cover which covers the electrode assembly when the measuring device is not operated.

The construction of the frusto-conical electrode 22 will be now in detail described referring to FIG. 2. The stationary electrode 22 is formed of a sheet metal and includes a plurality of longitudinally extending trapezoidal alternating voltage inducing openings 22' formed in a circumferentially spaced relationship and a plurality of smaller or auxiliary vertically spaced transverse anti-modulation or anti short-circuit openings 22" formed between adjacent longitudinal openings. The remaining solid area of the electrode 22 where no openings are provided forms the charge induction face of the associated electrode 22. Similarly, the rotary shielding electrode 29 (see FIG. 2) is formed of the same material as that of which the stationary electrode 22 is formed and includes a plurality of longitudinally extending trapezoidal alternating voltage inducing openings 29' formed in a circumferentially spaced relationship. As clearly shown in FIG. 2, since the area of each of the stationary and rotary electrodes where the openings are formed occupies a substantial portion of the whole area of the associated electrode and one electrode rotates relative to the other electrode when the measuring device is in operation, the possibility that water accumulates in the annular space between the electrodes can be effectively eliminated. Accumulation of water in the annular space may cause short-circuit and is helped to be drained out through the anti short-circuit openings 29".

When it is desired to operate the electric field intensity measuring device in the open air in a thunder-storm, the line 30 is connected to an external power source (not shown) which may be a domestic wall socket, for example, the output take-out line 16 is connected to a thunder alarm and the cover 31 is removed from the housing 11. Then, charge is induced on the solid surface area of the stationary electrode means 22 and applied to the amplifier 14 through the line 15. The output appearing at the outlet side of the amplifier 14 is applied to the thunder alarm through the line 16 and the thunder alarm then applies signals to a recorder (not shown) which is operatively connected to the thunder alarm.

With the above construction and arrangement of the component parts of the electric field intensity measuring device of the invention, even when the measuring device is operated in the open air under severe conditions such as in heavy rain, for example, the sensibility of the measuring device will not be adversely affected to thereby assure precise measuring results. And the charge induction face of the stationary electrode will not be adversely affected by electrostatic charge which may otherwise remain for a long time and cause error in measuring. Thus, it will be noted that the present invention has provided a stable and practical electric field intensity measuring device which is suitably and reliably operated in the open air.

Although the present invention has been described in its preferred form with a certain degree of particularity, it is understood that the present disclosure of the preferred form has been made only by way of example and that numerous changes in the details of construction and arrangement of parts may be resorted to without departing from the spirit and the scope of the invention as hereinafter claimed.

What is claimed is:

1. A rotary electric field intensity measuring device comprising a housing, stationary frusto-conical electrode means secured to said housing and having alternating voltage inducing means, an induced charge takeout line connected to said stationary electrode means, shielding frusto-conical rotary electrode means spaced above said stationary electrode means and having alternating voltage inducing means in cooperation with said stationary electrode means, and means to rotate said rotary electrode means.

2. The rotary electric field intensity measuring device as set forth in claim 1, in which each of said stationary and rotary electrode means is formed of a sheet metal and has the frusto-conical shape thereof with the base of the cone vertically below the apex thereof.

3. The rotary electric field intensity measuring device as set forth in claim 2, in which said stationary electrode means is shielded by said rotary electrode means and has dimensions smaller than those of said rotary electrode means.

4. The rotary electric field intensity measuring device as set forth in claim 1, further including a hollow insulation column which is secured to said housing and to which said stationary electrode means is secured, and a metal shielding sleeve surrounding said column to define an air space therebetween and secured to said housing.

5. The rotary electric field intensity measuring device as set forth in claim 1, in which said alternating voltage inducing means of each electrode means comprises a plurality of circumferentially spaced and longitudinally extending openings formed in the associated electrode means.

6. The rotary electric field intensity measuring device as set forth in claim 1, including anti short-circuit means in said stationary electrode means.

7. The rotary electric field intensity measuring device as set forth in claim 6, wherein said anti short-circuit means comprises a plurality of spaced openings formed in said stationary electrode means.

8. The rotary electric field intensity measuring device as set forth in claim 5, including anti short-circuit means in said stationary electrode means, said anti short-circuit means comprising a plurality of vertically spaced transverse openings formed in said stationary electrode means between adjacent ones of said longitudinally extending openings.

* * * * *